United States Patent
Singh et al.

(10) Patent No.: US 12,231,033 B2
(45) Date of Patent: Feb. 18, 2025

(54) ACTIVE GATE DRIVER FOR WIDE BAND GAP POWER SEMICONDUCTOR DEVICES

(71) Applicant: EATON INTELLIGENT POWER LIMITED, Dublin (IE)

(72) Inventors: Yash Veer Singh, Menomonee Falls, WI (US); Armen Baronian, Toronto (CA); Piranavan Suntharalingam, Menomonee Falls, WI (US); Mikhail Goykhman, Reseda, CA (US); Galen Chui, Ladera Ranch, CA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 235 days.

(21) Appl. No.: 17/909,215

(22) PCT Filed: Mar. 5, 2021

(86) PCT No.: PCT/EP2021/025094
§ 371 (c)(1),
(2) Date: Sep. 2, 2022

(87) PCT Pub. No.: WO2021/175496
PCT Pub. Date: Sep. 10, 2021

(65) Prior Publication Data
US 2023/0089458 A1    Mar. 23, 2023

Related U.S. Application Data

(60) Provisional application No. 62/986,441, filed on Mar. 6, 2020.

(51) Int. Cl.
*H02M 1/08* (2006.01)
*H02M 1/00* (2006.01)
(Continued)

(52) U.S. Cl.
CPC ........ *H02M 1/083* (2013.01); *H02M 1/0009* (2021.05); *H02M 1/0054* (2021.05); *H02M 1/36* (2013.01); *H02M 1/44* (2013.01)

(58) Field of Classification Search
CPC ...................................................... H02M 1/083
(Continued)

(56) References Cited

U.S. PATENT DOCUMENTS 5,089,719 A * 2/1992 Kamei ............. H03K 17/08122
327/109
10,103,551 B2   10/2018 Hopperdietzel
(Continued)

FOREIGN PATENT DOCUMENTS

| EP | 0 420 582 A2 | 4/1991 |
|---|---|---|
| EP | 2 811 648 A1 | 12/2014 |
| IN | 201641042631 A | 5/2018 |
| WO | 2018/225083 A1 | 12/2018 |

OTHER PUBLICATIONS

Idir et al., "Active Gate Voltage Control of Turn-on di/dt and Turn-off dv/dt in Insulated Gate Transistors," IEEE Transactions on Power Electronics, vol. 21, No. 4, pp. 849-855 (Jul. 2006).
(Continued)

*Primary Examiner* — Tomi Skibinski
(74) *Attorney, Agent, or Firm* — Merchant & Gould P.C.

(57) ABSTRACT

A gate drive circuit of a wide band gap power device (IGBT) includes a buffer, a di/dt sensing network, a turn-on circuit portion and turn-off circuit portion. The buffer, responsive to turn-on, supplies a first current via the first current path to the gate of the IGBT, and responsive to turn-off ceases the supply of the first current. The di/dt sensing network receives a feedback control signal representative of a voltage measurement across a parasitic inductance that exists between a Kelvin emitter and a power emitter of the IGBT. The turn-on circuit portion, responsive to turn-on and a
(Continued)

parasitic inductance of zero volts, supplies a second current via a second current path to the gate of the IGBT. The turn-off circuit portion, responsive to turn-off and a parasitic inductance of zero volts, discharges a gate capacitance of the IGBT through both the first current path and a third current path.

15 Claims, 4 Drawing Sheets

(51) Int. Cl.
 *H02M 1/36* (2007.01)
 *H02M 1/44* (2007.01)
(58) Field of Classification Search
 USPC .......................................................... 327/365
 See application file for complete search history.

(56) References Cited

U.S. PATENT DOCUMENTS 10,461,732 B1 10/2019 Norling et al.
2007/0200602 A1* 8/2007 Ishikawa ............ H03K 17/0406
 327/110

OTHER PUBLICATIONS

International Search Report and Written Opinion of the International Searching Authority for International Patent Application No. PCT/EP2021/025094 mailed May 31, 2021, 10 pages.
Ghorbani, H. et al., "A Simple Closed-Loop Active Gate Voltage Driver for Controlling diC/dt and dvCE/dt in IGTSs", Electronics, 8:1-18 (2019).

* cited by examiner

ACTIVE GATE DRIVER FOR WIDE BAND GAP POWER SEMICONDUCTOR DEVICES

CROSS-REFERENCE TO RELATED APPLICATION

This application is a National Stage Application of PCT/EP2021/025094, filed on Mar. 5, 2021, which claims the benefit of U.S. Patent Application Ser. No. 62/986,441, filed on Mar. 6, 2020, the disclosures of which are incorporated herein by reference in their entireties. To the extent appropriate, a claim of priority is made to each of the above disclosed applications.

TECHNICAL FIELD

The present disclosure is directed to gate drivers and, more particularly, to active gate drivers for wide band gap (WBG) power semiconductor devices.

BACKGROUND

Hybrid-electric and all-electric aircraft are increasingly becoming more relevant in the aerospace industry. To optimize the design of the new air vehicles, high voltage and high current electrical systems are being introduced into new models. Various voltages are being proposed for future aircraft ranging from 230 V AC to 1000 V DC and above. Wide band gap (WBG) semiconductor materials (e.g., silicon carbide and gallium nitride) enable power electronics to operate at these higher voltages as well as at higher temperatures and frequencies making power electronics made from these materials significantly more powerful and energy-efficient than those made from conventional semiconductor materials. Fast switching transients of WBG power devices (e.g., converters) helps to achieve low switching losses, however, at the same time, these transients introduce electromagnetic interference (EMI) and/or electromagnetic compatibility (EMC) issues with WBG power devices as well as introduce the possibility of false turn-ons of the devices.

SUMMARY

The present disclosure is directed to devices, systems, and methods of implementing a gate driver for wide band gap (WBG) power devices.

In certain aspects the present disclosure is directed to a gate drive circuit of a wide band gap (WBG) power device in the form of an insulated gate bipolar transistor (IGBT). The gate drive circuit includes a buffer, a di/dt sensing network, a turn-on circuit portion, and a turn-off circuit portion. The buffer is coupled via a first current path to a gate of the IGBT and is capable of being supplied with a turn-on command and a turn-off command. Upon being supplied with the turn-on command, the buffer supplies a first current via the first current path to the gate of the IGBT. Upon being supplied with a turn-off command, the buffer ceases the supply of the first current. The di/dt sensing network receives a feedback control signal representative of a voltage measurement across a parasitic inductance that exists between a Kelvin emitter and a power emitter of the IGBT. The turn-on circuit portion, upon the buffer being supplied with the turn-on command and the di/dt sensing network receiving a feedback control signal representative of zero volts measured across the parasitic inductance, supplies a second current via a second current path to the gate of the IGBT in addition to the first current supplied by the buffer. The turn-off circuit portion, upon the buffer receiving the turn-off command and the di/dt sensing network receiving a feedback control signal representative of zero volts measured across the parasitic inductance, discharges a gate capacitance of the IGBT through both the first current path and a third current path.

BRIEF DESCRIPTION OF THE DRAWINGS

Non-limiting and non-exhaustive examples are described in the present disclosure with reference to the following Figures.

FIG. 4 is a block diagram of an active gate driver circuit for turn-on.

DETAILED DESCRIPTION

Figure 1:
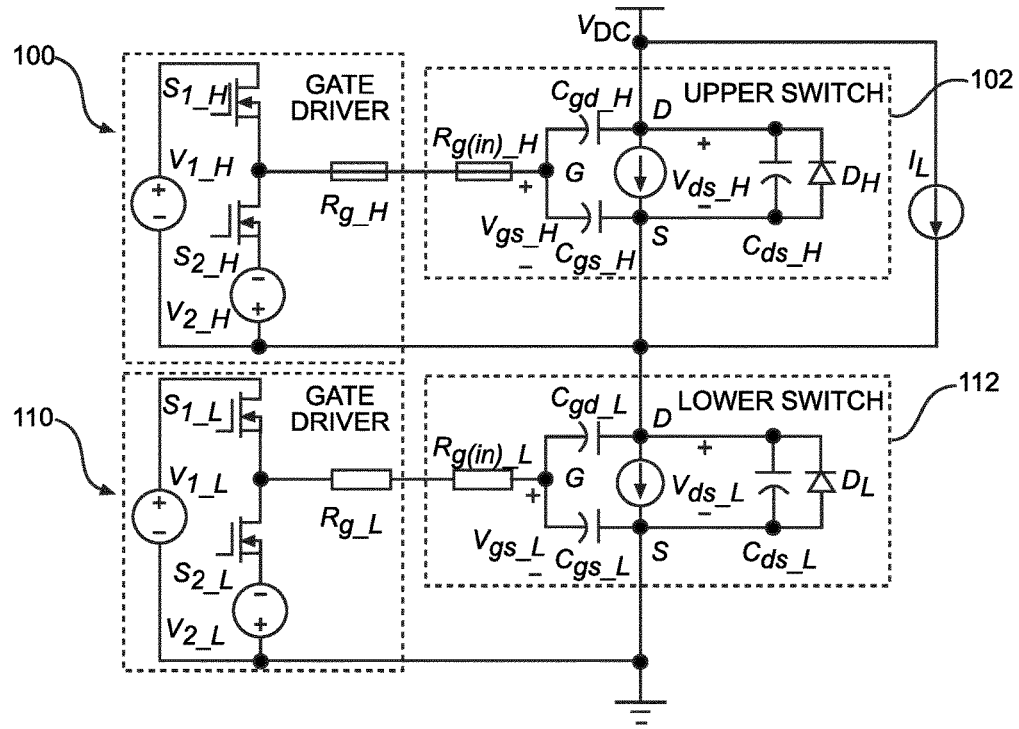
FIG. 1 is a prior art conventional gate driver circuit for a phase leg of a power converter.

Various embodiments will be described in detail with reference to the drawings, wherein like reference numerals represent like parts and assemblies throughout the several views. Reference to various embodiments does not limit the scope of the claims attached hereto. Additionally, an examples set forth in this disclosure are not intended to be limiting and merely set forth some of the possible embodiments for the appended claims.

Whenever appropriate, terms used in the singular will also include the plural and vice versa. The use of "a" herein means "one or more" unless otherwise stated or where the use of "one or more" is clearly inappropriate. The use of "or" means "and/or" unless stated otherwise. The use of "comprise," "comprises," "comprising," "include," "includes," and "including" are interchangeable and not intended to be limiting. For example, the term "including" shall mean "including but not limited to." The term "such as" is also not intended to be limiting.

Gate drivers serve as the interface between a low power input and a power device. Gate drivers operate to produce a high current drive input for the gate of a high power transistor. As an interface element, the operation of a gate driver can have a significant effect on the operation of its associated power device. Accordingly, design features of the gate drivers need to reflect desired operation of the associated power device.

FIG. 1 depicts a prior art configuration of a conventional gate drive circuit that is recommended by several power semiconductor device manufacturers. As shown, a first gate drive circuit 100 supplies the input to the gate of a conventional upper switch 102 of a phase leg of a power converter while a second gate drive circuit 110 supplies the input to the gate of a conventional lower switch 112 of the phase leg of the power converter. The gate drive circuits 102, 112 operate with fixed gate voltages and resistors, which must be designed to accommodate tradeoffs between switching behaviors, such as switching speed, switching loss, crosstalk suppression and switch stress.

Gate driver designs used to address these switching behaviors in conventional power devices can generally be grouped into three broad control categories comprising gate drivers with passive control, gate drivers with open-loop control and gate drivers with closed-loop control.

Passive control gate drivers for conventional power devices generally consist of a switchable voltage source and a gate resistor (or a combination of gate resistors); no feedback signals are monitored to make adjustments within the circuit. Passive gate drivers are a widely used approach.

Open-loop control gate drivers for conventional power devices use an open-loop control approach that employs switchable (or adjustable) gate resistors along with gate current source/sink or gate voltage to control current slopes or voltage slopes during switching transients of the conventional power device. Passive or active components can be added to the open-loop gate driver circuit to meet design criteria. The main strategies for open-loop control include controlling gate voltage, gate current and gate loop impedance. As with passive gate drivers, open-loop gate drivers utilize no feedback signals.

Closed-loop control gate drivers for conventional power devices utilize both drain-source voltage ($V_{ds}$) and drain current ($I_d$) as feedback signals to measure $dV_{ds}/dt$ and $dI_d/dt$ and compare them to a desired voltage slope and a desired current slope, respectively. In order to achieve separate gate control during different switching subintervals, a feedback control with sensors to identify the subintervals is used. The feedback control is implemented with high bandwidth analog circuits with small signal transistors or with a digital approach, such as a field programmable gate array (FPGA) with high-speed high-resolution digital-to-analog (D/A) and analog-to-digital (A/D) conversion. Thus, switching loss and electromagnetic interface (EMI) can be controlled in a closed-loop gate driver with significantly more complexity.

As with conventional power devices, design criteria considerations for a gate driver of a wide band gap (WBG) power device (e.g., silicon carbide power devices or gallium nitride power devices) include switching characteristics of the WBG power device and a control scheme to manage those characteristics. More specifically, design considerations of the gate driver for WBG power devices of the present disclosure include, but are not limited to, safe switching operation of the WBG power device, preventing shoot-through occurrence in the WBG power device, reducing switching losses, controlling switching speed and time, and improving electromagnetic interference (EMI) of the WBG power converter.

Further, in order to fully utilize the high switching speed capability and behavior of WBG power devices, a first gate driver of the present disclosure is specifically designed to best serve the upper WBG power device in a phase-leg configuration of a converter and a second gate driver of the present disclosure is specifically designed to best serve the lower WBG power device in the phase-leg configuration of the converter.

Switching behavior during turn-on and turn-off transients in a WBG power device, particularly a silicon carbide (SiC) power device, can be divided into four subintervals: switching delay subinterval, current commutation subinterval (i.e., di/dt transient), voltage commutation subinterval (i.e., dv/dt transient), and finally the ensuing ringing subinterval. Among them, di/dt, dv/dt, and ringing subintervals have a significant impact on switching speed, switching losses, and switch stresses. Specifically, during the turn-on transient, the excellent reverse recovery characteristics of SiC power devices result in negligible reverse recovery loss even given the high di/dt induced reverse recovery of the power device's internal antiparallel diode. Also, the modest transconductance and large internal gate resistance due to the small chip size of SiC power devices as compared to their Si counterparts limit the di/dt as well. Thus, unlike the design criterion of active gate drives for Si power devices, fast gate drives for SiC power devices no longer need to limit the switching device di/dt. However, high dv/dt induced crosstalk is critical for SiC power devices on account of the low threshold voltage and the large internal gate resistance. Therefore, the gate driver of SiC power devices should have the capability of crosstalk suppression; otherwise, SiC's switching speed has to be sacrificed to avoid the potential hazard of shoot-through failure induced by crosstalk. During the turn-off transient due to the low negative allowable maximum gate voltage, the spurious gate voltage triggered by crosstalk can easily exceed the gate voltage rating of SiC power devices. Hence, similar to the turn-on transient, crosstalk mitigation during the turn-off transient is necessary for the gate drive design.

Figure 2:
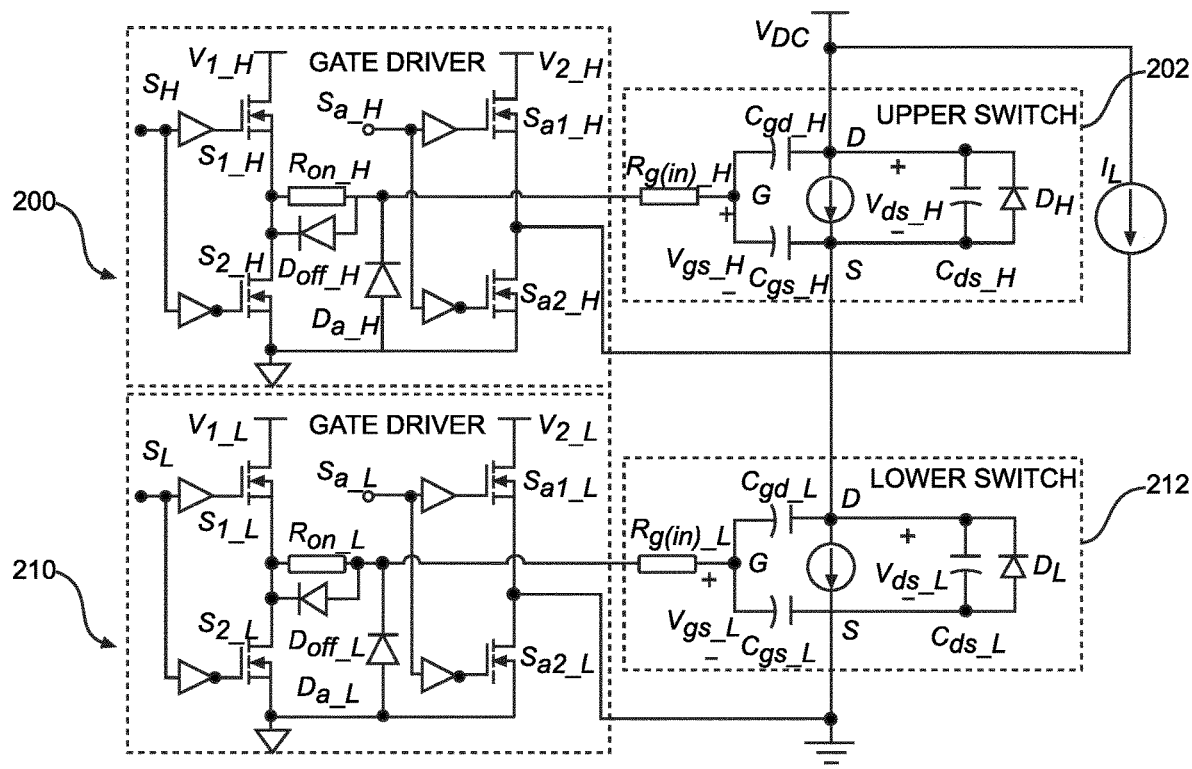
FIG. 2 is a gate driver circuit for a phase leg of a power converter that can be practiced with the principles described herein.

In view of the design considerations discussed herein, FIG. 2 illustrates a gate driver circuit 200 for WBG power devices designed for fast switching and crosstalk suppression. As shown, a first gate drive circuit 200 supplies the input to the gate of a WBG power device upper switch 202 of a phase leg of a power converter while a second drive circuit 210 supplies the input to the gate of a WBG power device lower switch 212 of the phase leg of the power converter. Compared with conventional gate driver circuit 100 (S1 H and S2H) or 110 (S1 L and S2 L) of FIG. 1, the gate driver circuits for WBG power devices additionally include two auxiliary transistors and two diodes. For example, the gate driver circuit 200 includes auxiliary transistors Sal H and Sat H with diodes DaH and Doff H while the gate driver circuit 210 includes auxiliary transistors Sal L and Sat L with diodes DaL and Doff L.

Figure 3:
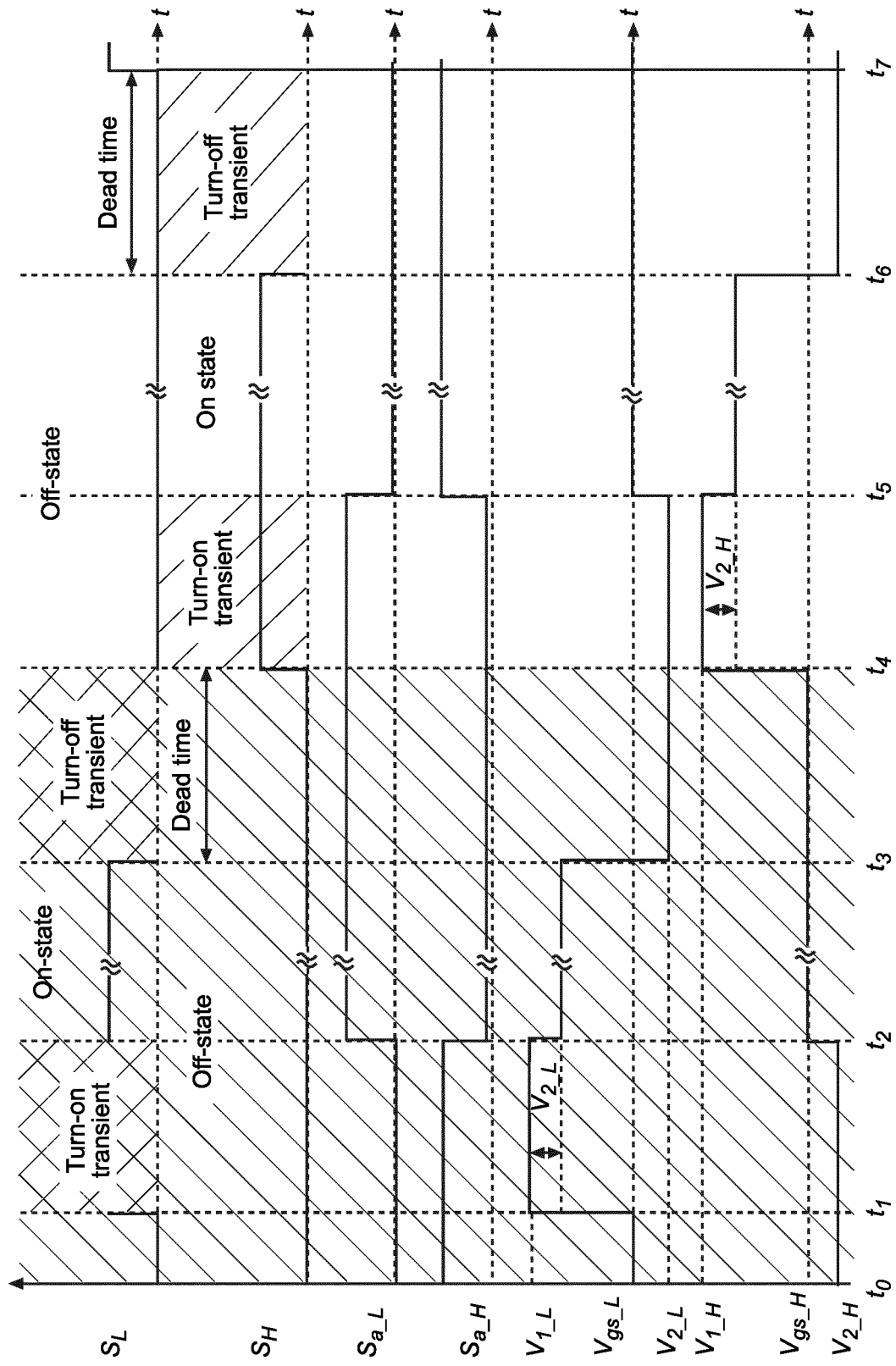
FIG. 3 illustrates the logic signal of the gate driver circuit of FIG. 2.

FIG. 3 illustrates the logic signals for the WBG power devices 202, 212 and their respective gate drive circuits 200, 202. Note that the delay time between the main driving signal and the auxiliary signal in FIG. 3 is preferably set as the switching time. As shown, the gate driver circuit 200, 210, each of which includes a turn-on section and a turn-off section, is based on di/dt feedback control that focuses on reducing the switching loss, delay, and total switching time, while maintaining the switching stress and EMI noise level during both turn-on and turn-off transients.

Figure 4:
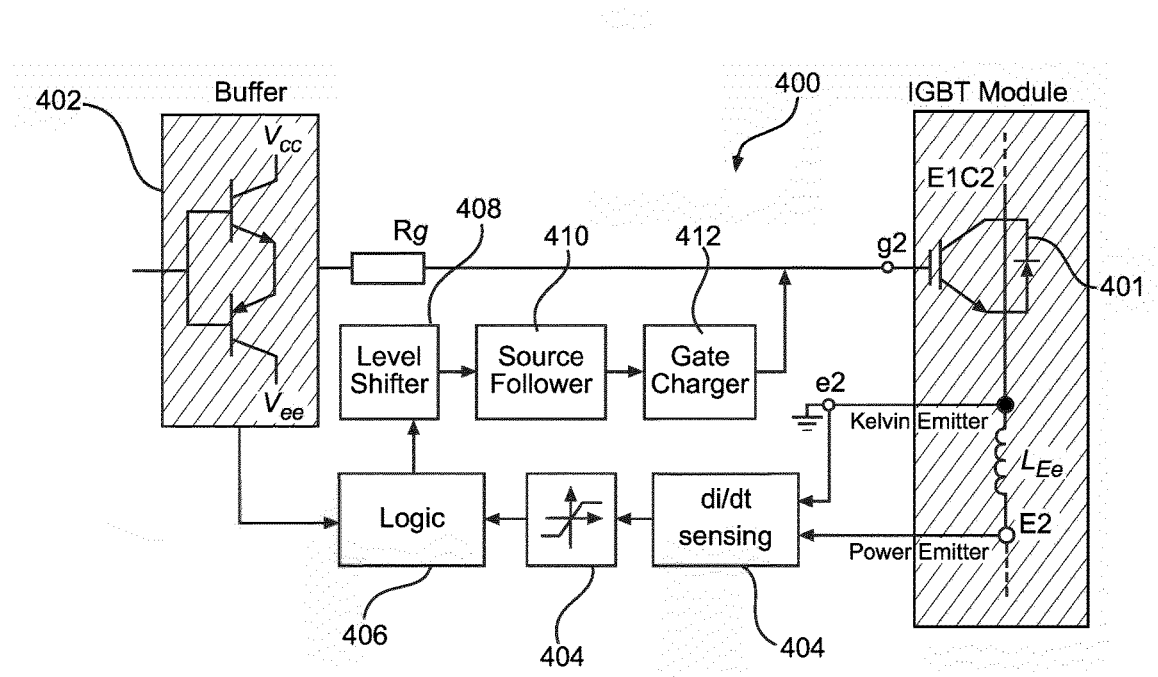

A block diagram of the turn-on section 400 of each gate driver 200, 202 of FIG. 2 is illustrated in FIG. 4. As illustrated, a WBG power device 401 (e.g., IGBT) is coupled to the turn-on section 400 that includes a conventional totem pole gate drive structure (e.g., buffer 402) along with a di/dt sensing network 404, a logic circuit 406, a level shifter 408, a source follower 410 and a gate charger 412. The di/dt sensing network 404 is used to detect the different turn on phases. The feedback control signal is obtained using the measurement of voltage across the parasitic inductance LEe between a Kelvin emitter e2 and a power emitter E2 of the power device 401.

Figure 5:
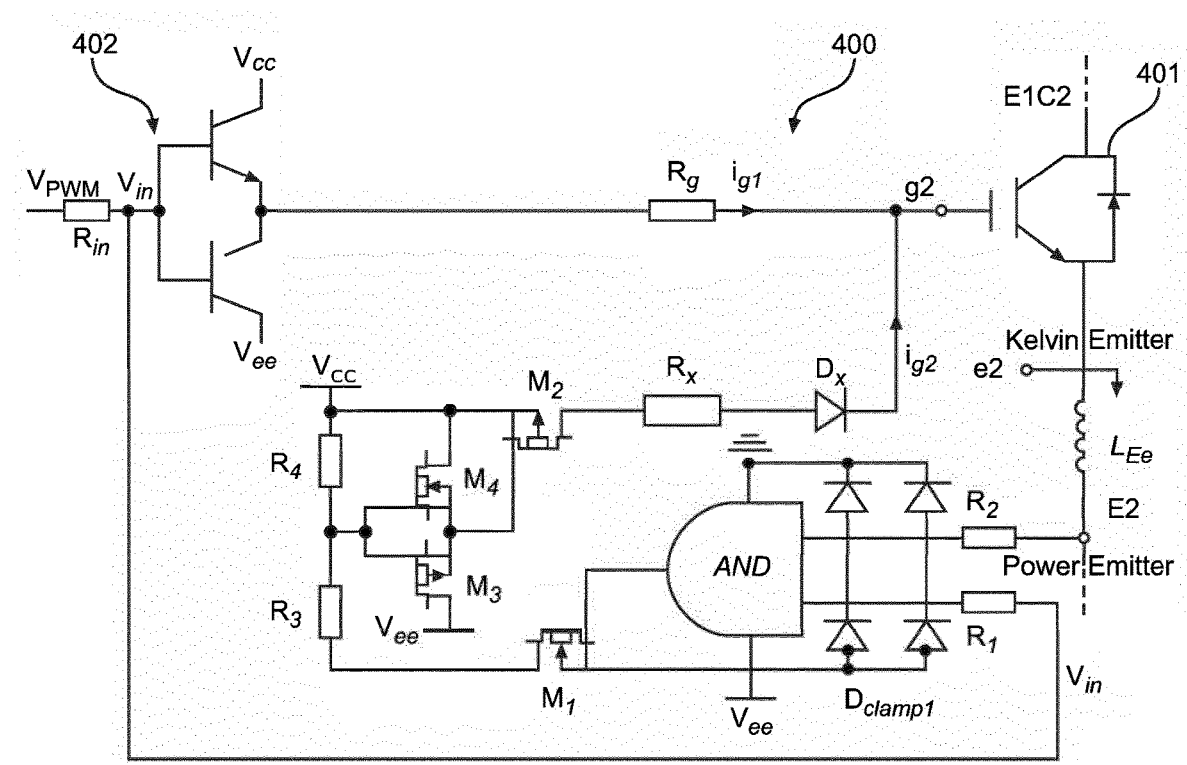
FIG. 5 is a circuit implementation of the block diagram of FIG. 4.

FIG. 5 illustrates the circuit implementation of the turn-on section 400 of the gate driver (e.g., gate driver 200 or gate driver 202). In operation, when the turn-on command Vin is applied at the turn-on delay stage, the voltage across parasitic inductance LEe is zero since no current is flowing through the IGBT. At this instant, the output of the AND logic gate is high, which activates the level shifter's small-signal MOSFET M1, and, subsequently, the source follower MOSFET M3 and gate charger MOSFET M2 are turned on. Hence, the IGBT gate emitter capacitance Cge is now charged by the conventional gate current ig1 together with an additional current ig2.

Figure 6:
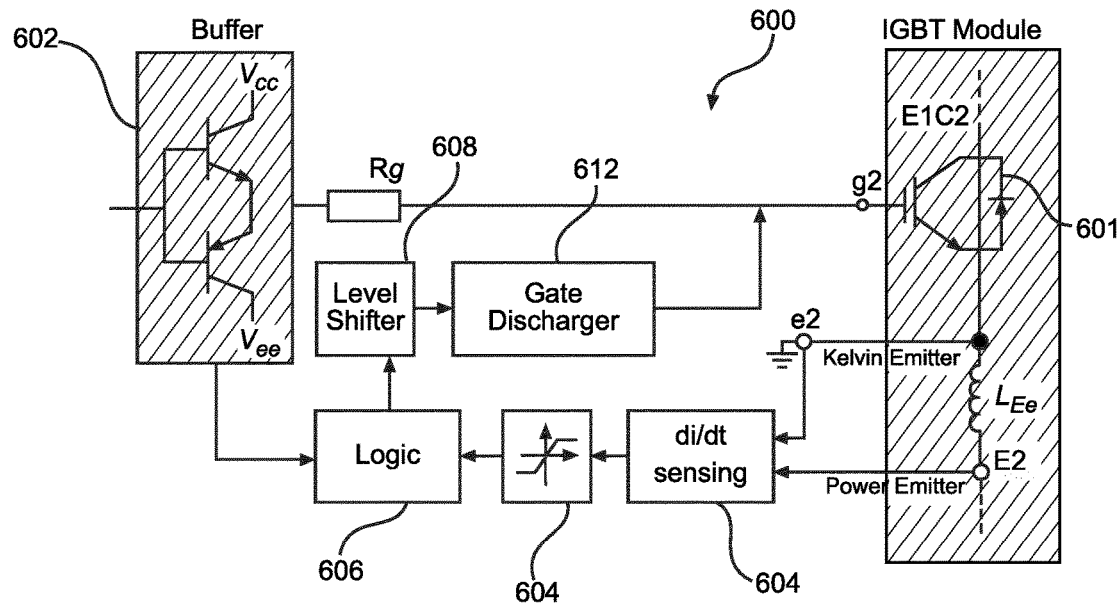
FIG. 6 is a block diagram of an active gate driver circuit for turn-off.

A block diagram of the turn-off section 600 of each gate driver 200, 202 of FIG. 2 is illustrated in FIG. 6. As illustrated, a WBG power device 601 (e.g., IGBT) is coupled to the turn-off section 600 that includes a conventional totem pole gate driver structure (e.g., buffer 602) along with a di/dt sensing network 604, a logic circuit 606, a level shifter 608 and a gate discharger 612. The functionality of the turn-off section 600 is similar to the functionality of the turn-on section 400 with the exception that there is no source follower or gate charger, and the gate discharger 612 is controlled to remove current from gate capacitance during a certain period of the turn-off transient.

Figure 7:
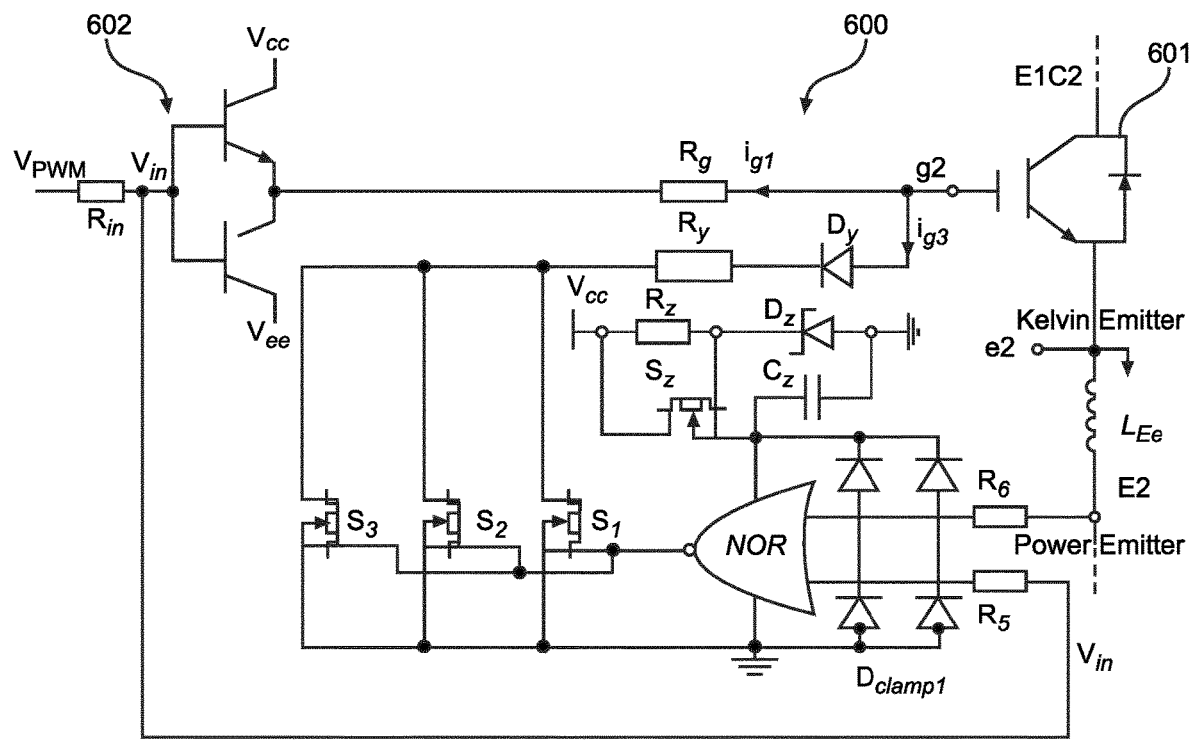
FIG. 7 is a circuit implementation of the block diagram of FIG. 6.

FIG. 7 illustrates the circuit implementation of the turn-off section 600 of the gate driver (e.g., gate driver 200 or gate driver 202). In operation, when the turn-off command Vin is applied to the gate driver, the voltage across parasitic inductance LEe stays zero during both the turn-off delay stage and the voltage rising stage since no current is flowing through the IGBT. The output of the NOR logic gate is high, which activates the paralleled level shifter small-signal MOSFETs, and the gate discharger. The IGBT gate-emitter capacitance is then effectively discharged by the conventional gate current ig1 together with an additional current ig3. The higher total gate current charges the Miller capacitor more rapidly, and thus results in a shorter voltage tail duration and lower turn-off switching loss.

The various embodiments described above are provided by way of illustration only and should not be construed to limit the claims attached hereto. Those skilled in the art will readily recognize various modifications and changes that may be made without following the example embodiments and applications illustrated and described herein, and without departing from the true spirit and scope of the following claims.

What is claimed:

1. A gate drive circuit for a wide band gap (WBG) power device in the form of an insulated gate bipolar transistor (IGBT), comprising:
   a buffer coupled via a first current path to a gate of the IGBT, the buffer capable of being supplied with a turn-on command and a turn-off command, the buffer supplying a first current via the first current path to the gate of the IGBT upon being supplied with the turn-on command and stopping supply of the first current upon being supplied with the turn-off command;
   a di/dt sensing network receiving a feedback control signal representative of a voltage measurement across a parasitic inductance that exists between a Kelvin emitter and a power emitter of the IGBT;
   a turn-on circuit portion that, upon the buffer being supplied with the turn-on command and the di/dt sensing network receiving a feedback control signal representative of zero volts measured across the parasitic inductance, supplies a second current via a second current path to the gate of the IGBT in addition to the first current supplied by the buffer; and
   a turn-off circuit portion, upon the buffer receiving the turn-off command and the di/dt sensing network receiving a feedback control signal representative of zero volts measured across the parasitic inductance, discharges a gate capacitance of the IGBT through both the first current path and a third current path.

2. The gate driver circuit of claim 1, wherein the turn-on circuit portion includes a logic gate output to activate a first level shifter.

3. The gate driver circuit of claim 2, wherein the logic gate comprises an AND gate that receives an input from the power emitter of the IGBT and a turn-on/turn-off command supplied to the buffer.

4. The gate driver circuit of claim 2, wherein the activated first level shifter of the turn-on circuit portion activates a source follower and a gate charger to supply the second current.

5. The gate driver circuit of claim 1, wherein the turn-off circuit portion includes a logic gate output to activate a second level shifter.

6. The gate driver circuit of claim 5, wherein the logic gate comprises a NOR gate that receives an input from the power emitter of the IGBT and a turn-on/turn-off command supplied to the buffer.

7. The gate driver circuit of claim 5, wherein the activated second level shifter of the turn-off circuit portion activates a gate discharger to provide the third current path.

8. A power converter comprising:
   a wide band gap (WBG) power device upper switch having an input supplied by a first drive circuit;
   a WBG power device lower switch having an input supplied by a second drive circuit;
   wherein each of the first and second drive circuits comprise:
      a totem pole gate driver that supplies a first current on a first current path to a gate of the respective upper or lower WBG power device switch;
      first and second auxiliary diodes; and
      first and second auxiliary transistors,
   wherein the first and second auxiliary diodes and transistors operate in conjunction with a feedback control signal representative of a voltage measurement across a parasitic inductance that exists between a Kelvin emitter and a power emitter of the respective upper or lower WBG power device switch and a turn-on/turn-off command of the totem pole gate driver to provide a second current path to deliver a second current to the gate of the respective upper or lower WBG power device switch during the turn-on command of the totem pole gate driver and to provide third current path to discharge a gate capacitance of the respective upper or lower WBG power device switched during the turn-off command of the totem pole gate driver.

9. A power converter comprising:
   a wide band gap (WBG) power device upper switch having an input supplied by a first drive circuit;
   a WBG power device lower switch having an input supplied by a second drive circuit;
   wherein each of the first and second drive circuits comprise:
      a buffer coupled via a first current path to a gate of the respective upper or lower WBG power device switch, the buffer capable of being supplied with a turn-on command and a turn-off command, the buffer supplying a first current via the first current path to the gate of the respective upper or lower WBG power device switch upon being supplied with the turn-on command and stopping supply of the first current upon being supplied with the turn-off command;

a di/dt sensing network receiving a feedback control signal representative of a voltage measurement across a parasitic inductance that exists between a Kelvin emitter and a power emitter of the respective upper or lower WBG power device switch;

a turn-on circuit portion that, upon the buffer being supplied with the turn-on command and the di/dt sensing network receiving a feedback control signal representative of zero volts measured across the parasitic inductance, supplies a second current via a second current path to the gate of the respective upper or lower WBG power device switch in addition to the first current supplied by the buffer; and a turn-off circuit portion, upon the buffer receiving the turn-off command and the di/dt sensing network receiving a feedback control signal representative of zero volts measured across the parasitic inductance, discharges a gate capacitance of the respective upper or lower WBG power device switch through both the first current path and a third current path.

10. The power converter of claim 9, wherein the turn-on circuit portion includes a logic gate output to activate a first level shifter.

11. The power converter of claim 10, wherein the logic gate comprises an AND gate that receives an input from the power emitter of the IGBT and a turn-on/turn-off command supplied to the buffer.

12. The power converter of claim 10, wherein the activated first level shifter of the turn-on circuit portion activates a source follower and a gate charger to supply the second current.

13. The power converter of claim 9, wherein the turn-off circuit portion includes a logic gate output to activate a second level shifter.

14. The power converter of claim 13, wherein the logic gate comprises a NOR gate that receives an input from the power emitter of the IGBT and a turn-on/turn-off command supplied to the buffer.

15. The power converter of claim 13, wherein the activated second level shifter of the turn-off circuit portion activates a gate discharger to provide the third current path.

* * * * *